(12) United States Patent
Lin et al.

(10) Patent No.: US 10,608,086 B2
(45) Date of Patent: Mar. 31, 2020

(54) SEMICONDUCTOR STRUCTURE WITH DIFFUSION BARRIER REGION AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ger-Pin Lin, Tainan (TW); Tien-Chen Chan, Tainan (TW); Shu-Yen Chan, Changhua County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/854,769

(22) Filed: Dec. 27, 2017

(65) Prior Publication Data
US 2018/0190771 A1    Jul. 5, 2018

(30) Foreign Application Priority Data

Dec. 29, 2016  (CN) .......................... 2016 1 1246125

(51) Int. Cl.
*H01L 27/108*  (2006.01)
*H01L 21/265*  (2006.01)
(Continued)

(52) U.S. Cl.
CPC ...... *H01L 29/0847* (2013.01); *H01L 21/2236* (2013.01); *H01L 21/26513* (2013.01); *H01L 23/535* (2013.01); *H01L 27/1082* (2013.01); *H01L 27/10814* (2013.01); *H01L 27/10823* (2013.01); *H01L 27/10855* (2013.01); *H01L 27/10867* (2013.01); *H01L 27/10876* (2013.01); *H01L 27/10885* (2013.01); *H01L 27/10891* (2013.01); *H01L 29/167* (2013.01); *H01L 29/4236* (2013.01)

(58) Field of Classification Search
CPC ......... H01L 27/10814; H01L 27/10823; H01L 27/10876; H01L 21/26513; H01L 21/2652; H01L 29/4236
See application file for complete search history.

(56) References Cited

U.S. PATENT DOCUMENTS 5,504,041 A * 4/1996 Summerfelt ............ H01L 28/75
  257/E21.021
5,859,451 A * 1/1999 Narita ............... H01L 27/10808
  257/296

(Continued)

*Primary Examiner* — Phat X Cao
(74) *Attorney, Agent, or Firm* — Winston Hsu

(57) ABSTRACT

The present invention provides a semiconductor structure, the semiconductor structure includes a substrate, at least one active area is defined on the substrate, a buried word line is disposed in the substrate, a source/drain region disposed beside the buried word line, a diffusion barrier region, disposed at the top of the source/drain region, the diffusion barrier region comprises a plurality of doping atoms selected from the group consisting of carbon atoms, nitrogen atoms, germanium atoms, oxygen atoms, helium atoms and xenon atoms, a dielectric layer disposed on the substrate, and a contact structure disposed in the dielectric layer, and electrically connected to the source/drain region.

17 Claims, 9 Drawing Sheets

(51) Int. Cl.
  *H01L 29/423*  (2006.01)
  *H01L 29/08*  (2006.01)
  *H01L 21/223*  (2006.01)
  *H01L 29/167*  (2006.01)
  *H01L 23/535*  (2006.01)

(56) References Cited

U.S. PATENT DOCUMENTS

| | | | |
|---|---|---|---|
| 6,277,720 B1 * | 8/2001 | Doshi | H01L 21/31116 |
| | | | 257/E21.252 |
| 6,444,584 B1 * | 9/2002 | Hsiao | H01L 21/0276 |
| | | | 257/E21.029 |
| 6,448,590 B1 * | 9/2002 | Adkisson | H01L 21/82345 |
| | | | 257/202 |
| 2002/0022357 A1 * | 2/2002 | Iijima | H01L 27/10855 |
| | | | 438/622 |
| 2006/0065935 A1 * | 3/2006 | Vandentop | H01L 21/6835 |
| | | | 257/369 |
| 2011/0241106 A1 * | 10/2011 | Lee | H01L 29/165 |
| | | | 257/330 |
| 2013/0062670 A1 * | 3/2013 | Wong | H01L 29/66636 |
| | | | 257/288 |

* cited by examiner

SEMICONDUCTOR STRUCTURE WITH DIFFUSION BARRIER REGION AND MANUFACTURING METHOD THEREOF

BACKGROUND OF THE INVENTION

1. Field of the Invention

The present invention relates to a semiconductor structure and a method for forming the same, and more particularly, to a dynamic random access memory device with at least one diffusion barrier region and a method for forming the same.

2. Description of the Prior Art

Dynamic random access memory (hereinafter abbreviated as DRAM) is a volatile memory that commonly used as system memory. A memory cell array of DRAM has a configuration in which memory cells, each including an access metal oxide semiconductor (hereinafter abbreviated as MOS) transistor and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors.

SUMMARY OF THE INVENTION

The present invention provides a semiconductor structure, the semiconductor structure includes a substrate, at least one active area is defined on the substrate, at least one a buried word line disposed in the substrate within the active area, a source/drain region disposed beside the buried word line in the substrate, a diffusion barrier region, disposed at the top of the source/drain region, the diffusion barrier region comprises a plurality of doping atoms selected from the group consisting of carbon atoms, nitrogen atoms, germanium atoms, oxygen atoms, helium atoms and xenon atoms, a dielectric layer disposed on the substrate, and a contact structure disposed in the dielectric layer, and electrically connected to the source/drain region.

The present invention further a method for forming a semiconductor structure, the method including: first, a substrate is provided, at least one active area is defined on the substrate, at least one buried word line is formed in the substrate within the active area, a source/drain region is formed beside the buried word line in the substrate. In addition, a diffusion barrier region is formed at the top of the source/drain region, the diffusion barrier region includes a plurality of doping atoms selected from the group consisting of carbon atoms, nitrogen atoms, germanium atoms, oxygen atoms, helium atoms and xenon atoms. Next, a dielectric layer is formed on the substrate, and a contact structure is formed in the dielectric layer, and electrically connected to the source/drain region.

The present invention is characterized in that a diffusion barrier region is additionally formed between a contact plug (or contact structure) electrically connected to the storage node and a source/drain region disposed beside the buried gate (buried word line). The contact plug may contain an amorphous silicon layer doped with phosphorus atoms. Since the diffusion barrier region is doped with atoms which is not III-V group atoms (such as carbon atoms), it can prevent the phosphorus atoms in the contact plug diffusing to the source/drain regions, thereby preventing the electrical properties is influenced. Therefore, the present invention can improve the yield and quality of the DRAM structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method for forming a semiconductor device provided by a first preferred embodiment of the present invention, wherein FIG. 1 is a plan view and FIGS. 2-9 are cross-sectional views.

FIG. 2 is the cross-sectional view taken along a line A-A' of FIG. 1.

FIG. 3 to FIG. 9 are continued sectional views based on the sectional structure shown in FIG. 2.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
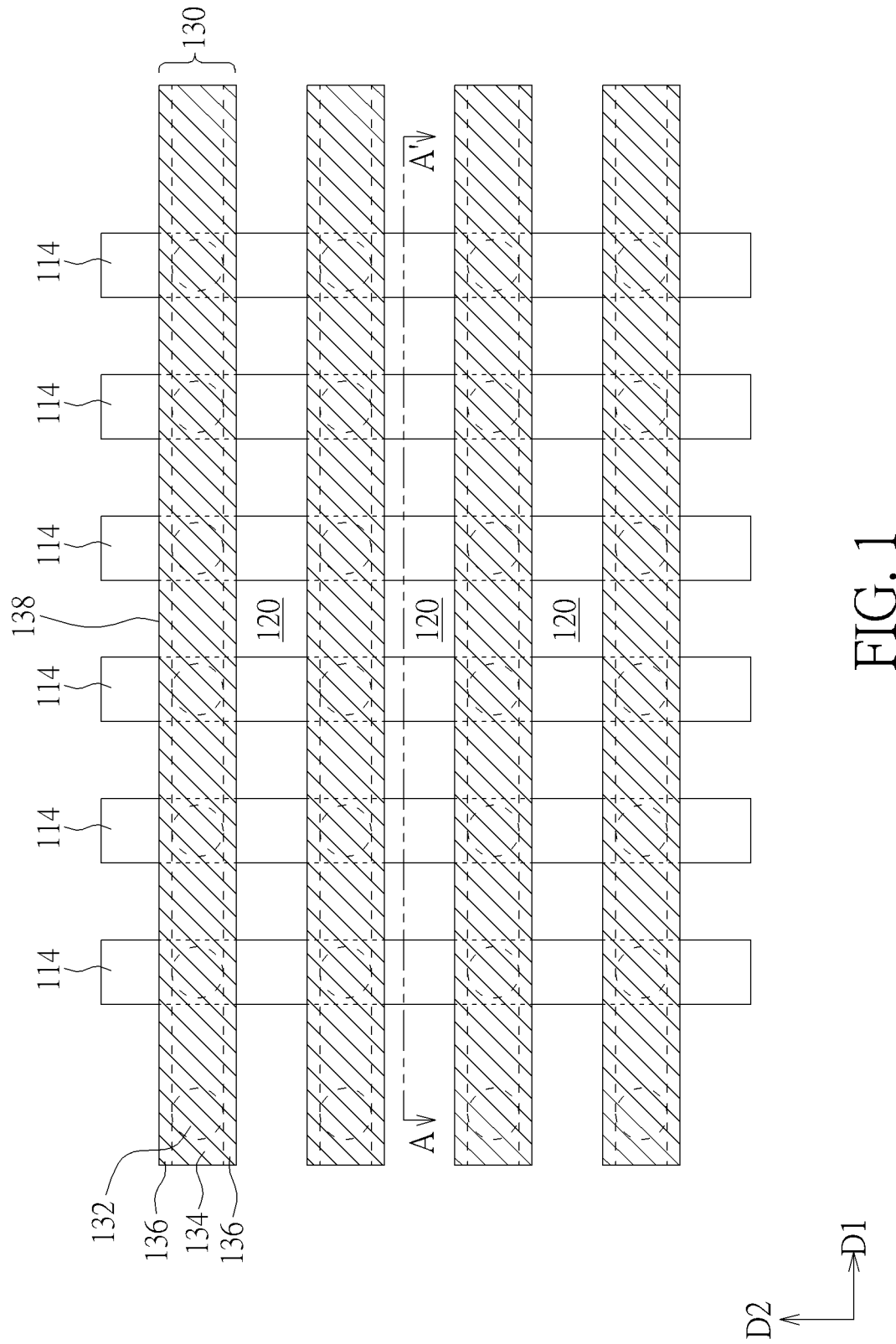
Figure 2:
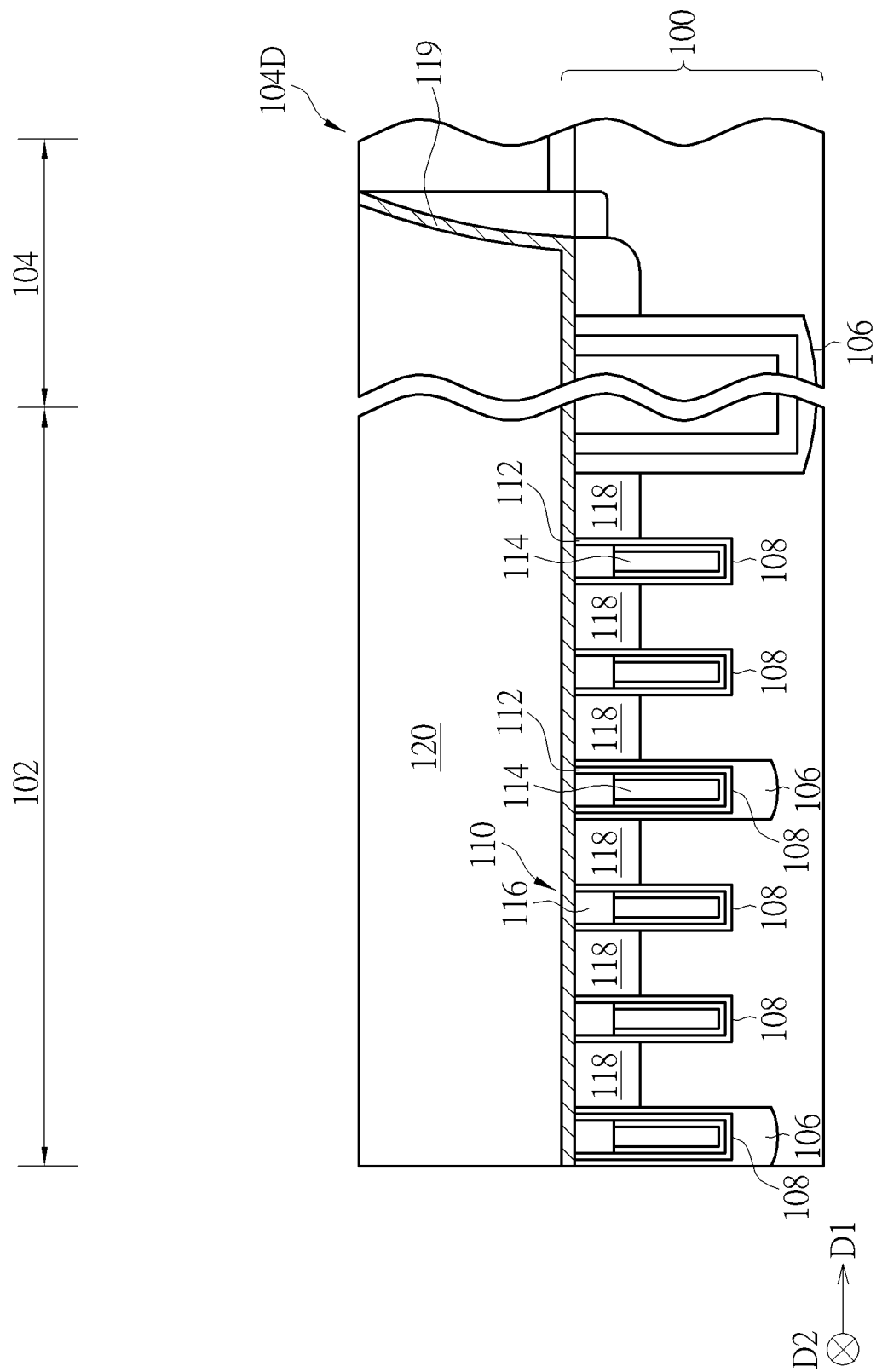

Please refer to FIGS. 1-9, which are schematic drawings illustrating a method for forming a semiconductor device provided by a first preferred embodiment of the present invention, wherein FIG. 1 is a plan view and FIGS. 2-9 are cross-sectional views. FIG. 2 is the cross-sectional view taken along a line A-A' of FIG. 1. As shown in FIG. 1 and FIG. 2, the method for forming the semiconductor device provides a substrate 100 including at least a memory cell region 102 and a peripheral region 104 defined therein. And a plurality of transistors 110 are formed in the memory cell region 102. In the preferred embodiment, the transistors 110 preferably include dynamic random access memory (hereinafter abbreviated as DRAM) cells, but not limited to this.

Please refer to FIG. 1 and FIG. 2. In some embodiments of the present invention, the transistors 110 can be formed by the following step. A plurality of shallow trench isolation (hereinafter abbreviated as STI) structures 106 are formed in the substrate 100 in the memory region 102 and the peripheral region 104. The STI structures 106 are formed to define regions for accommodating transistor devices and to provide electrical isolations between those devices. Next, a plurality of recesses 108 are formed in the substrate 100 and the STI structures 106 in the memory region 102. A dielectric layer 112 is then formed to cover sidewalls and bottoms of the recesses 108. Thereafter, a buried gate 114 is formed in each recess 108, please note that the buried gate here may also be deemed as a buried word line. After the buried gate 114 is formed, an insulating layer 116 is formed to seal each recess 108. Next, a source/drain region 118 is formed in the substrate 100 at two sides of the buried gates 114. It should be noted that the plurality of buried gates 114 are arranged along a first direction D1, and each of the buried gates 114 extends along a second direction D2 (the normal direction of the paper in FIG. 2) The first direction D1 and the second direction D2 are perpendicular to each other. Consequently, the transistors 110 are formed in the substrate 100 in the memory region 102. However, those skilled in the art would easily realize that the transistors 110 can be formed by any other suitable processes, and thus steps for forming the transistors are not limited to this. After forming the transistors 110, transistor device(s) 104D can be formed in the peripheral region 104 and followed by forming an etch stop layer 119 on the substrate 100, as shown in FIG. 1. It should be understood that the source/drain regions 118 of the transistors 110 in the memory region 102 and source/drain region (not shown) of the transistor device 104D in the peripheral region 104 can be formed simultaneously or sequentially, and those details are omitted in the interest of brevity.

Please still refer to FIG. 1. After forming the transistors 110 and the transistor device 104D, a first insulating layer 120 is formed on the substrate 100 and a plurality of bit line structures 130 are subsequently formed in the first insulating layer 120. The first insulating layer 120 includes a first insulating material, and the first insulating material can be, for example but not limited to, silicon oxide (SiO). As shown in FIG. 1, the bit line structure 130 may include a bit line contact plug 132, a bit line 134 physically and electrically connected to the bit line contact plug 132, spacers 136 disposed on sidewalls of the bit line 134, and capping layer 138 formed on the top of bit line 134. As shown in FIG. 1, each bit line structure 130 extends in the first direction D1, and the plurality of bit line structures 130 are arranged in the second direction D2 with each other. Therefore, the extending direction of the buried gates 114 is perpendicular to the extending direction of the bit line structure 130. In addition, it is worth noting that the spacers 136 of the bit line structure 130 and the capping layer 138 include a second insulating material, and the second insulating material is different from the first insulating material. For example, the second insulating material preferably includes silicon nitride (SiN) or silicon carbon nitride (SiCN), but is not limited thereto.

Figure 3:
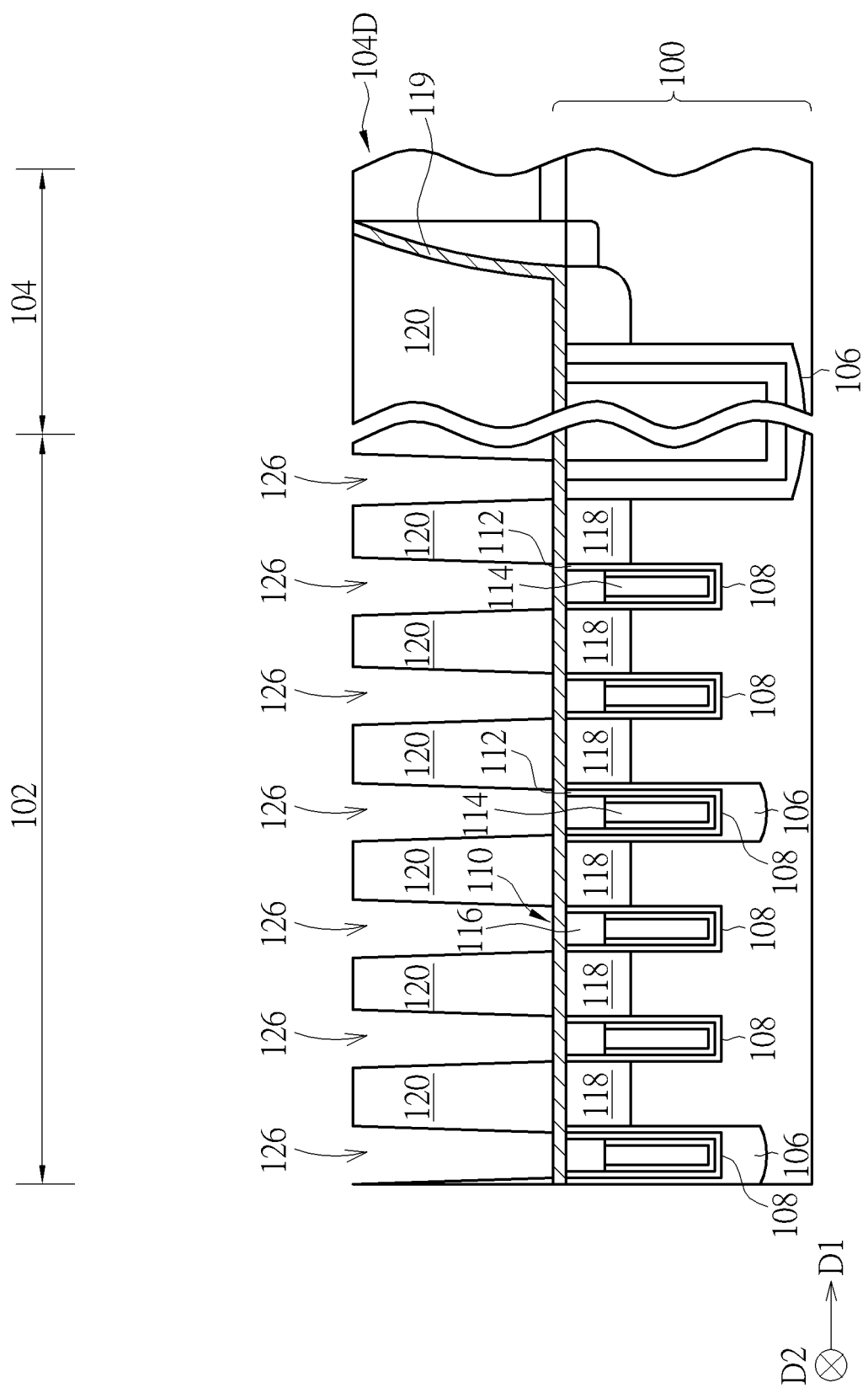

Please refer to FIG. 3, please note that the following FIG. 3 to FIG. 9 are continued sectional views based on the sectional structure shown in FIG. 2. A plurality of first mask patterns (not shown) are formed on the substrate 100. Next, using the first mask pattern as a protective layer, an etching step is performed to remove portions of the first insulating layer 120 to form a plurality of recesses 126. The position of each recess 126 corresponds to the position of each buried gate 114. The first mask pattern is then removed.

Figure 4:
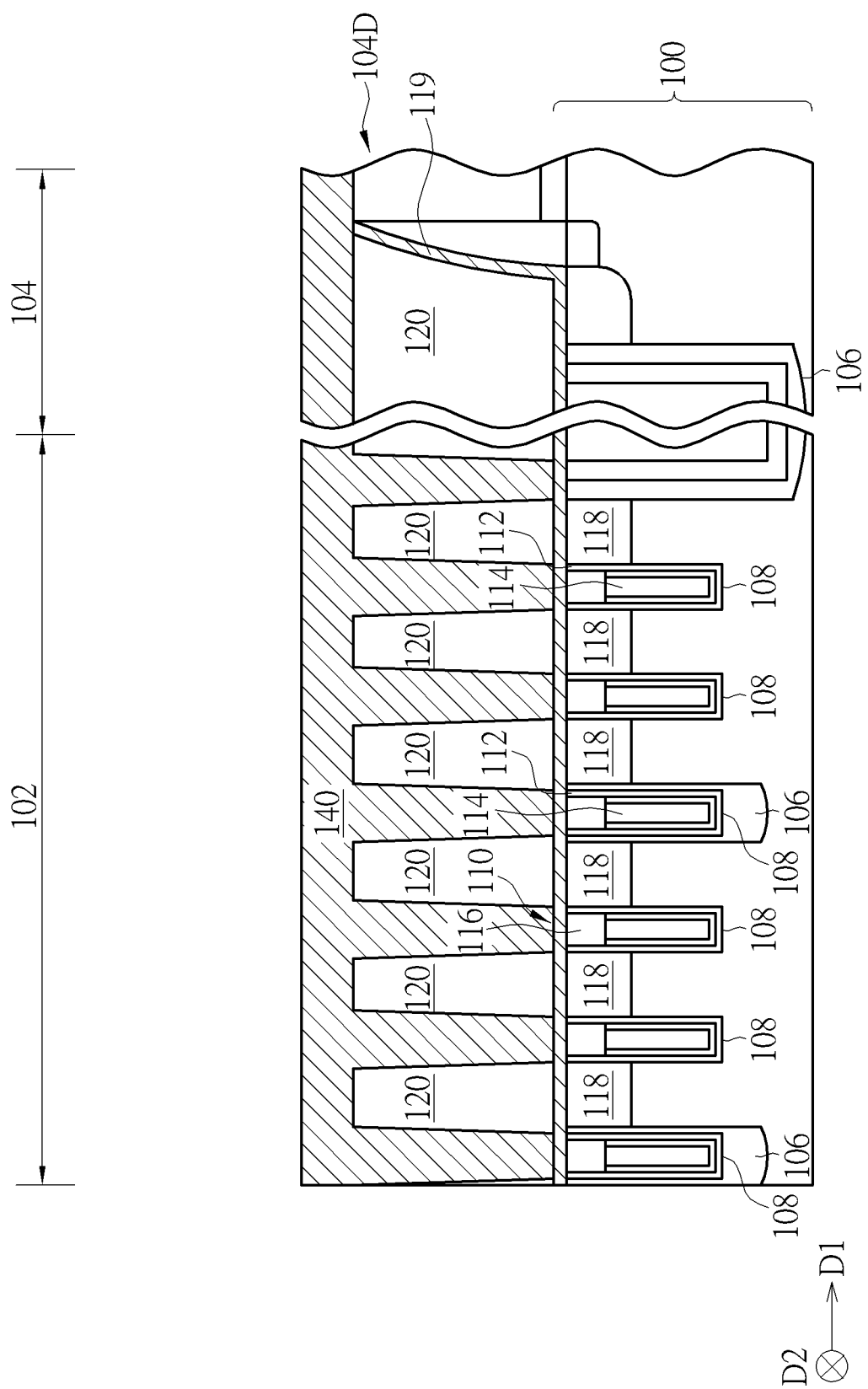

Please refer to FIG. 4, after forming the recesses 126, a second insulating layer 140 is formed on the substrate 100. The second insulating layer 140 fills up the recesses 126 and entirely covers a surface of the first insulating layer 120 and surfaces of the bit line structures 130. It is noteworthy that the second insulating layer 140 includes the second insulating material, such as silicon nitride (SiN), but not limited thereto.

Figure 5:
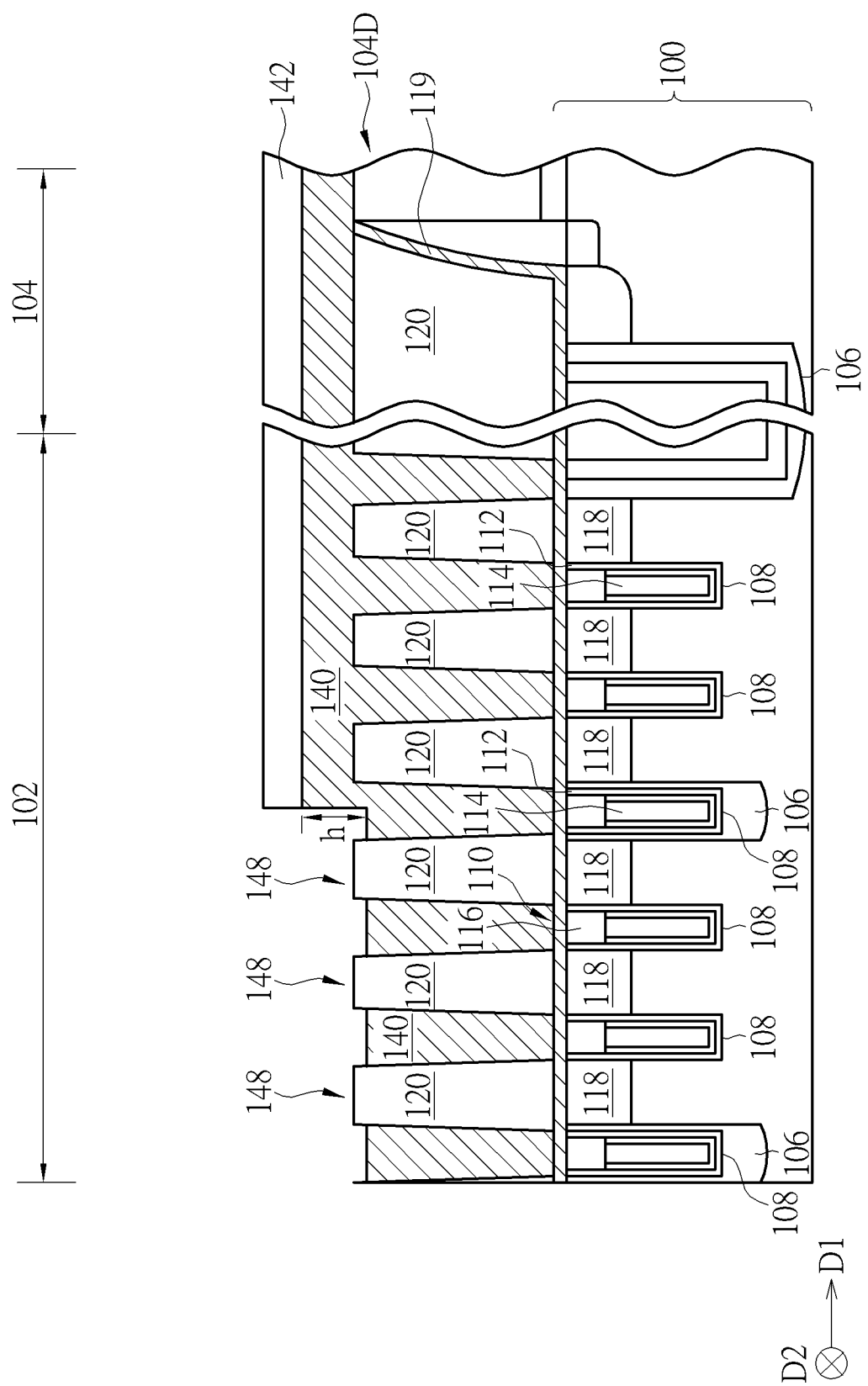

Please refer to FIG. 5. After forming the second insulating layer 140, a second mask pattern 142 exposing a portion of the second insulating layer 140 is formed in the memory cell region 102. Next, the exposed portion of the second insulating layer 140 is removed to form a plurality of second exposed portions 148 of the first insulating layer 120, and then the second mask pattern 142 is removed. Furthermore, since only the exposed portion of the second insulating layer 140 is removed from the memory cell region 102, a step height h is obtained on the top surface of the second insulating layer 140 in the memory cell region 102.

Figure 6:
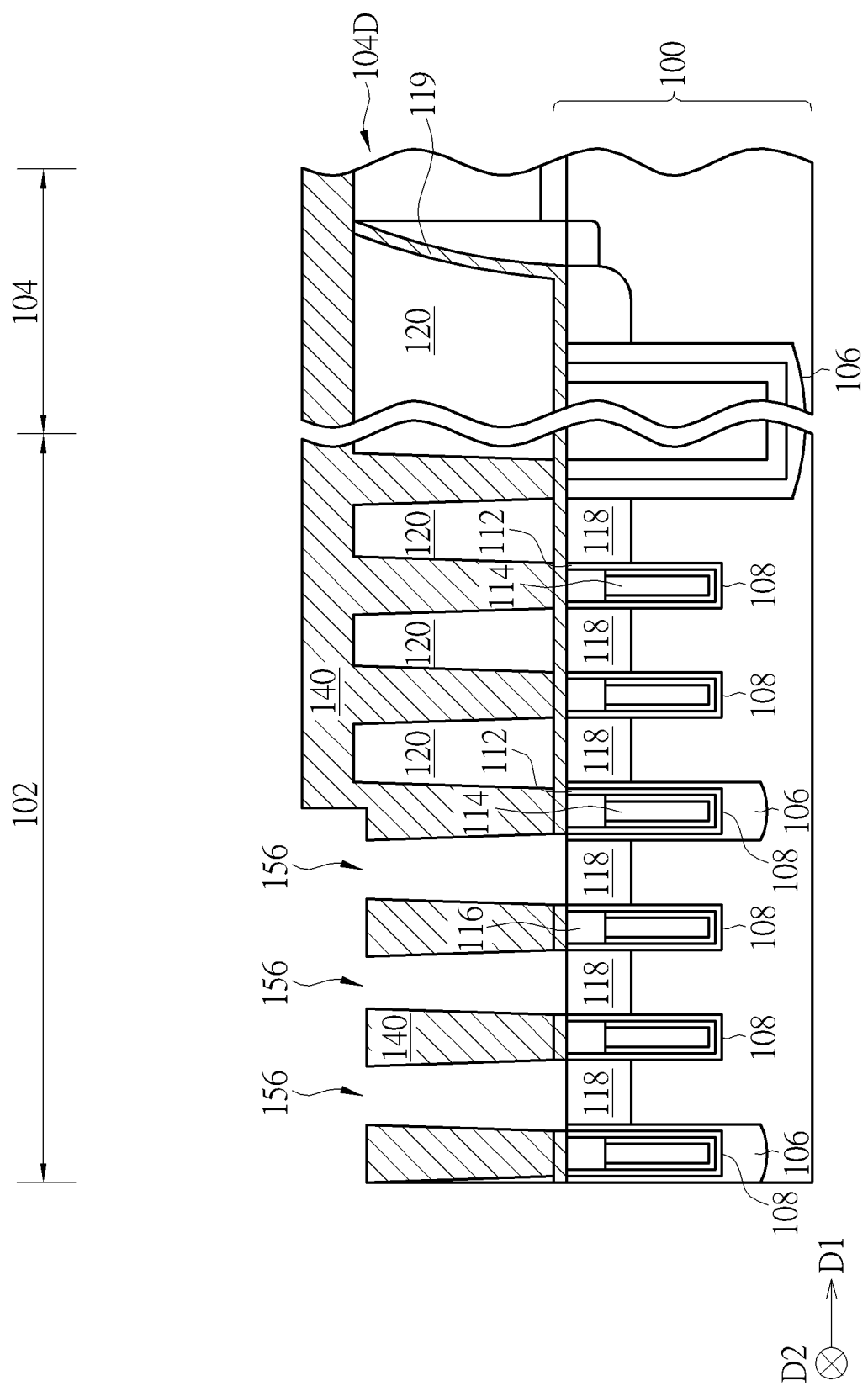

Please refer to FIG. 6. Next, the second exposed portions 148 of the first insulating layer 120 is removed to form a plurality of recesses 156, the recesses 156 expose the source/drain regions 118. Each of the recesses 156 mentioned here are the predetermined positions for forming the storage node contacts or the contact plugs that electrically connected to the storage node contacts in the subsequent steps. In other words, a contact plug may be formed in the recess 156 firstly, and then the storage node contact is electrically connected to the contact plug, or the storage node contact is directly formed in the recess 156.

Figure 7:
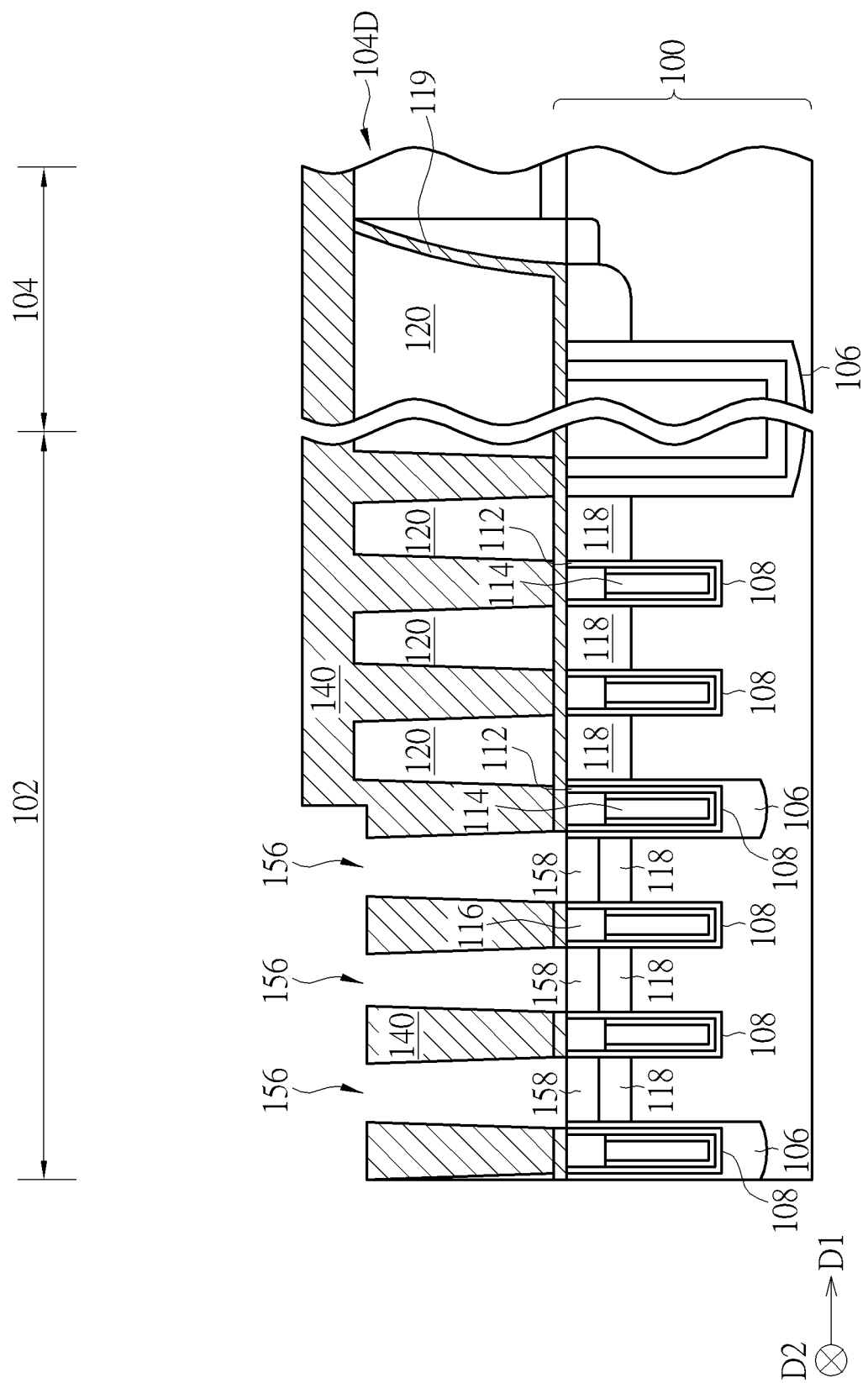

Next, as shown in FIG. 7, an atomic implantation process or a plasma implantation process is performed to form a diffusion barrier region 158 at the bottom of each recess 156, the diffusion barrier region 158 contains a plurality of dopant atoms. The dopant atoms may be selected from the group of carbon atoms, nitrogen atoms, germanium atoms, oxygen atoms, helium atoms, and xenon atoms. Preferably, atoms doped in the diffusion barrier region in the present invention do not contain III-V group atoms, such as boron atoms, etc., thereby preventing the electrical performance of the overall DRAM structure is influenced. The purpose of forming the diffusion barrier region 158 is to prevent the atoms (such as phosphorus atoms) in the contact structures or in the amorphous silicon layers that formed on the diffusion barrier region 158 are diffused into the source/drain regions 118 and affects the electrical properties. According to the applicant's experiment, doping carbon atoms in a substrate can effectively reduce the diffusion of phosphorus atoms. In the present invention, the concentration of atoms doped in the diffusion barrier region 158 is preferably between $1\times10^{13}/cm^2$ to $4\times10^{22}/cm^2$. It is noteworthy that the diffusion barrier region 158 is located at the top portion of the source/drain region 118, in other words, the diffusion barrier region 158 directly contacts the source/drain region 118. However, since the diffusion barrier region 158 contains different doping atoms from the doping atoms in the source/drain region 118, so the diffusion barrier region 158 can be considered as another area different from the source/drain regions 118.

Figure 8:
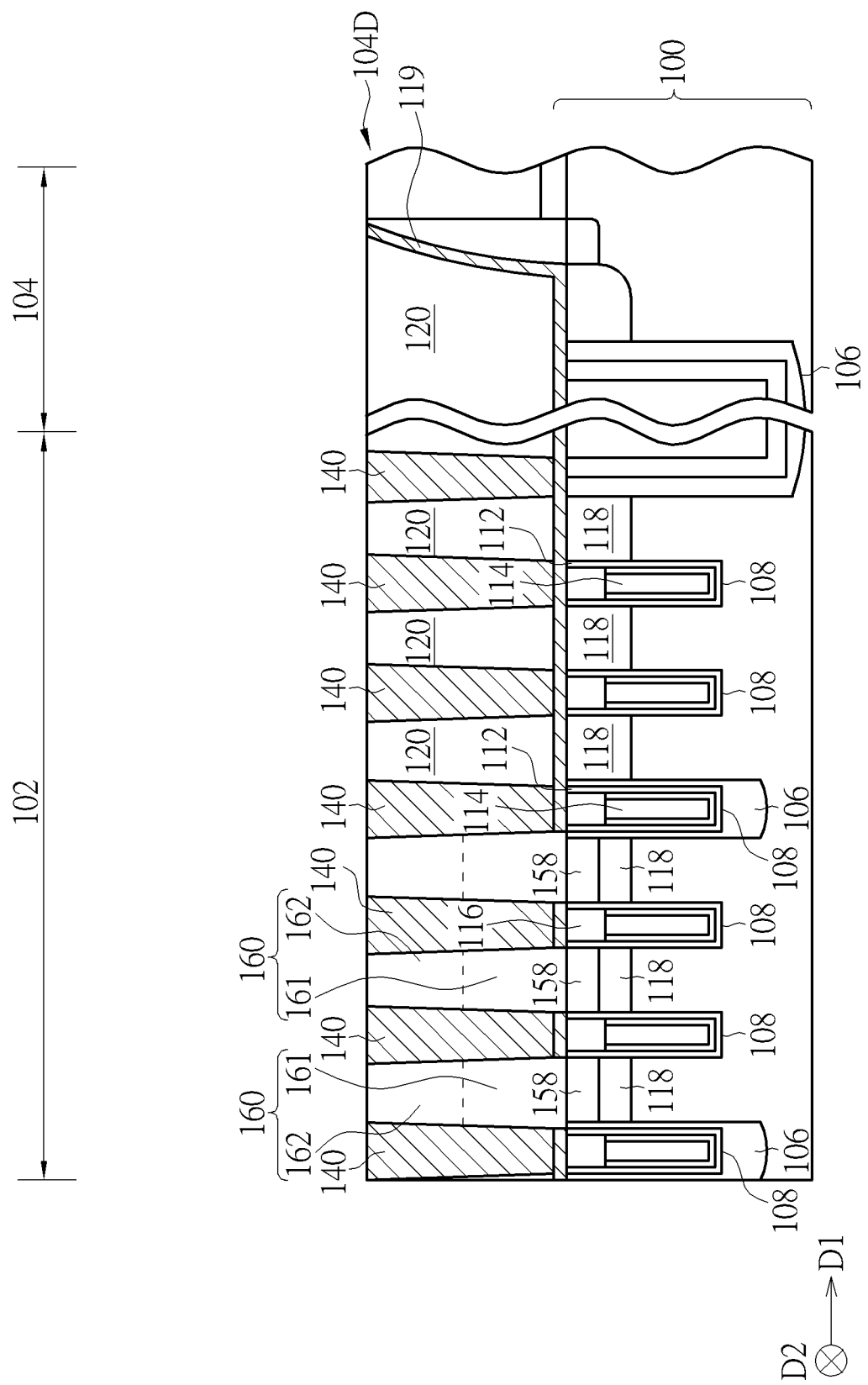
Figure 9:
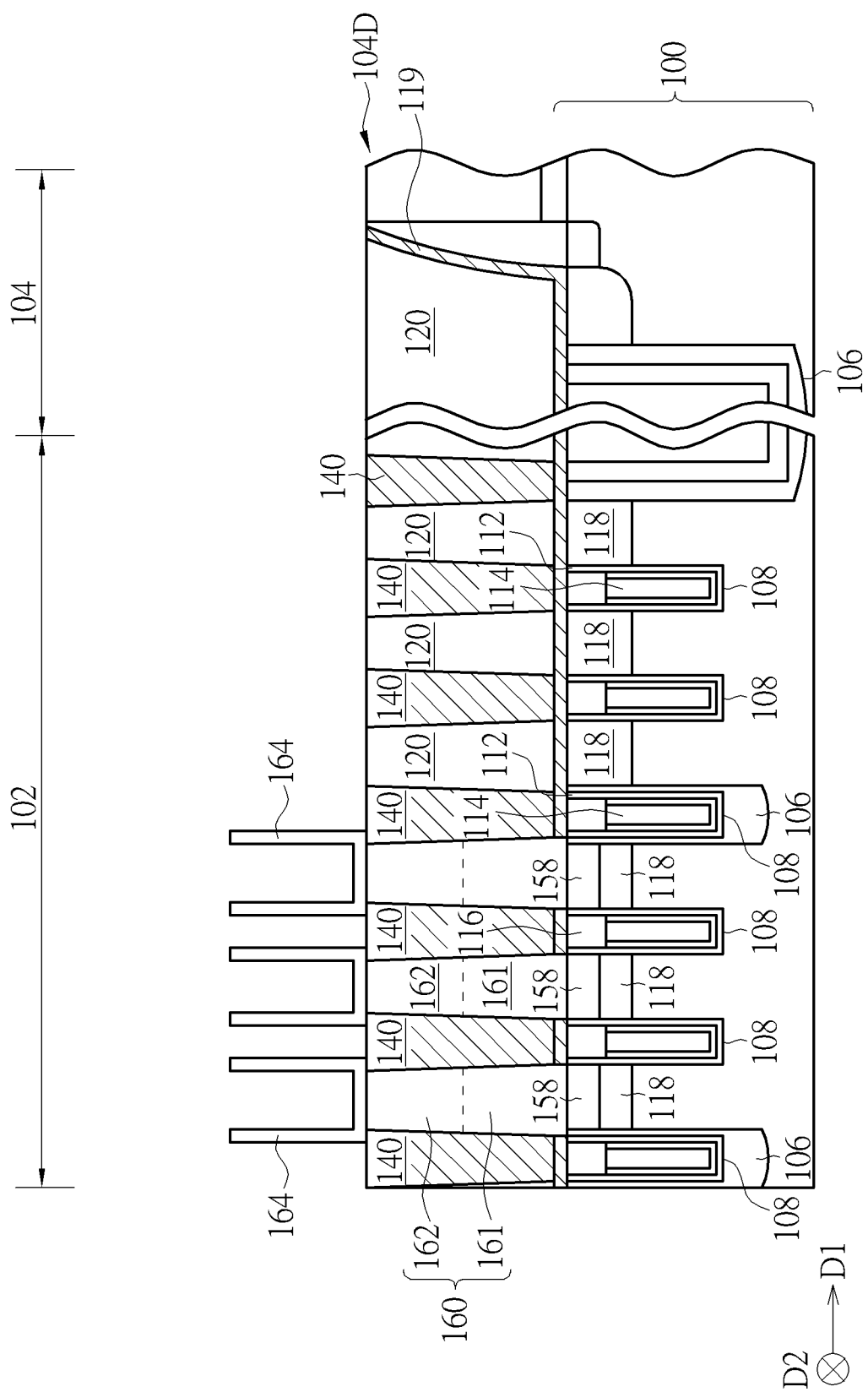

Next, please refer to FIG. 8 to FIG. 9. After forming the diffusion barrier region 158, a storage node contact 160 is then formed on the diffusion barrier region 158. In this embodiment, the storage node contact 160 includes a lower half portion 161 and an upper half portion 162, and the lower half portion 161 includes a doped amorphous silicon layer, for example, it may include an amorphous silicon layer doped with phosphorus (P) atoms. On the other hand, the upper half portion 162 includes an undoped amorphous silicon layer. In addition, a metal silicide layer (not shown) may be additionally formed above the storage node contact 160, but not limited thereto. The diffusion barrier region 158 mentioned above is formed between the lower half portion 161 of the storage node contact 160 and the source/drain region 118 to prevent the phosphorus atoms in the lower half portion 161 of the storage node contact 160 diffuse to the source/drain region 118 and affects electrical properties. Next, as shown in FIG. 9, at least one bottom electrode 164 is formed over each storage node contact 160. In the present invention, the bottom electrode 164 can be used as the bottom electrode of the capacitor in the DRAM structure. In the preferred embodiment, the bottom electrode 164 can be formed by conventional techniques. The material of the bottom electrode 164 includes, for example, conductive material such as metal or alloy. The bottom electrode 164 is electrically connected to the source/drain region 118 through the storage node contact 160. In addition, even though the bottom electrode 164 is directly formed on the storage node contact 160 in the present embodiment, however, in other embodiments, other contact structures may be formed between the bottom electrode 164 and the storage node contact 160. For example, a contact structure including a conductive layer (it may include materials such as tungsten) and a barrier layer (it may include materials such as titanium nitride) may be formed between the bottom electrode 164 and the storage node contact 160. It should also be within the scope of the present invention. Subsequently, the formation of the storage electrode landing pad and the capacitor can be further continued. This is a well-known technology in the art and will not be further described herein.

Therefore, please refer to FIGS. 1-9 mentioned above, the present invention provides a semiconductor structure. The important elements of the semiconductor structure includes a substrate 100, at least one active area 102 is defined on the substrate, at least one a buried word line (or buried gate) 114 disposed in the substrate 100 within the active area 102, at least one source/drain region 118 disposed beside the buried word line 114 in the substrate 100, a diffusion barrier region 158 disposed at the top of the source/drain region 118, the diffusion barrier region 158 comprises a plurality of doping atoms selected from the group consisting of carbon atoms, nitrogen atoms, germanium atoms, oxygen atoms, helium atoms and xenon atoms, and a storage node contact 160 disposed in the second insulating layer 140, and electrically connected to the source/drain region 118.

In summary, the present invention is characterized in that a diffusion barrier region is additionally formed between a contact plug (or contact structure) electrically connected to the storage node and a source/drain region disposed beside the buried gate (buried word line). The contact plug may contain an amorphous silicon layer doped with phosphorus atoms. Since the diffusion barrier region is doped with atoms which is not III-V group atoms (such as carbon atoms), it can prevent the phosphorus atoms in the contact plug diffusing to the source/drain regions, thereby preventing the electrical properties is influenced. Therefore, the present invention can improve the yield and quality of the DRAM structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate, at least one active area is defined on the substrate;
at least one a buried word line disposed in the substrate within the active area;
at least one insulating layer disposed on the buried word line in the substrate;
a first source/drain region and a second source/drain region disposed at two sides of the buried word line in the substrate;
a diffusion barrier region, disposed at the top of the first source/drain region, the diffusion barrier region comprises a plurality of doping atoms selected from the group consisting of carbon atoms, nitrogen atoms, germanium atoms, oxygen atoms, helium atoms and xenon atoms, wherein a top surface of the diffusion barrier region, a top surface of the second source/drain region and a top surface of the insulating layer are on a same level, and wherein a width of the diffusion barrier region is same as a width of the first source/drain region;
a dielectric layer disposed on the substrate; and
a contact structure disposed in the dielectric layer, and electrically connected to the first source/drain region.

2. The semiconductor structure of claim 1, further comprising at least one bit line located on the substrate in the active region, an extending direction of the buried word line is perpendicular to an extending direction of the bit line.

3. The semiconductor structure of claim 1, wherein a doping concentration of the dopant atoms in the diffusion barrier region is between $1\times10^{13}/cm^2$ to $4\times10^{22}/cm^2$.

4. The semiconductor structure of claim 1, further comprising a metal silicide layer disposed on the contact structure.

5. The semiconductor structure of claim 1, further comprising a storage node contact electrically connected to the contact structure.

6. The semiconductor structure of claim 1, wherein the contact structure comprises a doped amorphous silicon layer, and an undoped amorphous silicon layer disposed on the doped amorphous silicon layer.

7. The semiconductor structure of claim 6, wherein the doped amorphous silicon layer comprises a plurality of second dopant atoms, and the second dopant atoms comprise phosphorus atoms.

8. A method for forming a semiconductor structure, comprising:
providing a substrate, at least one active area is defined on the substrate;
forming at least one a buried word line in the substrate within the active area;
forming at least one insulating layer on the buried word line in the substrate;
forming a first source/drain region and a second source/drain region at two sides of the buried word line in the substrate;
forming a diffusion barrier region at the top of the first source/drain region, the diffusion barrier region comprises a plurality of doping atoms selected from the group consisting of carbon atoms, nitrogen atoms, germanium atoms, oxygen atoms, helium atoms and xenon atoms, and wherein a width of the diffusion barrier region is same as a width of the first source/drain region;

forming a dielectric layer on the substrate, wherein a top surface of the diffusion barrier region, a top surface of the second source/drain region and a top surface of the insulating layer are on a same level; and forming a contact structure in the dielectric layer, and electrically connected to the first source/drain region.

9. The method of claim 8, further comprising forming at least one bit line located on the substrate in the active region, an extending direction of the buried word line is perpendicular to an extending direction of the bit line.

10. The method of claim 8, wherein a doping concentration of the dopant atoms in the diffusion barrier region is between from $1\times10^{13}/cm^2$ to $4\times10^{22}/cm^2$.

11. The method of claim 8, further comprising forming a metal silicide layer on the contact structure.

12. The method of claim 8, further comprising forming a storage node contact electrically connected to the contact structure.

13. The method of claim 8, wherein the contact structure comprises a doped amorphous silicon layer, and an undoped amorphous silicon layer disposed on the doped amorphous silicon layer.

14. The method of claim 13, wherein the doped amorphous silicon layer comprises a plurality of second dopant atoms, and the second dopant atoms comprise phosphorus atoms.

15. The method of claim 8, wherein the method for forming the diffusion barrier region includes atomic implantation process or plasma implantation process.

16. The semiconductor structure of claim 1, wherein the plurality of doping atoms of the diffusion barrier region is selected from the group consisting of carbon atoms, germanium atoms, helium atoms and xenon atoms.

17. The method of claim 8, wherein the plurality of doping atoms of the diffusion barrier region is selected from the group consisting of carbon atoms, germanium atoms, helium atoms and xenon atoms.

* * * * *